United States Patent
Kim et al.

(10) Patent No.: US 10,096,686 B2
(45) Date of Patent: Oct. 9, 2018

(54) THIN FILM TRANSISTOR, FABRICATION METHOD THEREOF, REPAIR METHOD THEREOF AND ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Kiyong Kim, Beijing (CN); Liping Luo, Beijing (CN); Chaoqin Xu, Beijing (CN); Jeong Hun Rhee, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/435,610

(22) PCT Filed: Sep. 18, 2014

(86) PCT No.: PCT/CN2014/086783
§ 371 (c)(1),
(2) Date: Apr. 14, 2015

(87) PCT Pub. No.: WO2015/055069
PCT Pub. Date: Apr. 23, 2015

(65) Prior Publication Data
US 2016/0013281 A1    Jan. 14, 2016

(30) Foreign Application Priority Data

Oct. 16, 2013   (CN) .......................... 2013 1 0484547

(51) Int. Cl.
*H01L 29/41*      (2006.01)
*H01L 29/417*    (2006.01)
(Continued)

(52) U.S. Cl.
CPC .. *H01L 29/41733* (2013.01); *G02F 1/136259* (2013.01); *H01L 27/124* (2013.01); *H01L 27/1259* (2013.01)

(58) Field of Classification Search
CPC ............. H01L 29/41733; H01L 27/124; H01L 27/1259; G02F 1/136259
(Continued)

(56) References Cited

U.S. PATENT DOCUMENTS 4,902,638 A * 2/1990 Muto ................... G02F 1/13624
257/390
5,392,143 A * 2/1995 Akiyama ............ G02F 1/13624
345/93

(Continued)

FOREIGN PATENT DOCUMENTS

CN         1637552 A      7/2005
CN       101315505 A     12/2008
(Continued)

OTHER PUBLICATIONS

International Search Report dated Dec. 23, 2014; PCT/CN2014/086783.
(Continued)

*Primary Examiner* — Victor A Mandala
*Assistant Examiner* — Colleen E Snow
(74) *Attorney, Agent, or Firm* — Ladas & Parry LLP

(57) ABSTRACT

Embodiments of the present disclosure disclose a thin film transistor, a fabrication method thereof, a repair method thereof, and an array substrate. The thin film transistor comprises a gate electrode (12), a gate insulating layer (13), an active layer (14), a source electrode (16) and a drain electrode (17). The source electrode (16) comprises a first source electrode portion (161) and a second source electrode portion (162) independent from each other, the first source
(Continued)

electrode portion (161) and the second source electrode portion (162) are electrically connected with the active layer (14), respectively; and/or, the drain electrode (17) comprises a first drain electrode portion (171) and a second drain electrode portion (172) independent from each other, the first drain electrode portion (171) and the second drain electrode portion (172) are electrically connected with the active layer (14), respectively.

6 Claims, 6 Drawing Sheets

(51) Int. Cl.
  *G02F 1/1362* (2006.01)
  *H01L 27/12* (2006.01)
(58) Field of Classification Search
  USPC .......................................... 257/66, 72; 438/4
  See application file for complete search history.

(56) References Cited

U.S. PATENT DOCUMENTS

| | | | |
|---|---|---|---|
| 9,417,497 B1* | 8/2016 | Yao | G02F 1/136286 |
| 2005/0156848 A1 | 7/2005 | Lee | |
| 2008/0296582 A1 | 12/2008 | Zhao et al. | |
| 2010/0320473 A1 | 12/2010 | Liu | |
| 2012/0161131 A1 | 6/2012 | Kang et al. | |
| 2013/0075728 A1 | 3/2013 | Liu et al. | |
| 2013/0215341 A1* | 8/2013 | Rho | G02F 1/134309 349/15 |
| 2016/0343743 A1* | 11/2016 | Tang | H01L 29/786 |

FOREIGN PATENT DOCUMENTS

| | | |
|---|---|---|
| CN | 100592181 C | 2/2010 |
| CN | 101707211 A | 5/2010 |
| CN | 201893340 U | 7/2011 |
| CN | 102655156 A | 9/2012 |
| CN | 103489923 A | 1/2014 |
| JP | 2000-269516 A | 9/2000 |
| WO | 2012/081648 A1 | 6/2012 |

OTHER PUBLICATIONS

Written Opinion of the International Searching Authority dated Dec. 23, 2014; PCT/CN2014/086783.
First Chinese Office Action dated Aug. 26, 2015; Appln. No. 201310484547.9.
Second Chinese Office Action dated Feb. 1, 2016; Appln. No. 201310484547.9.
Third Chinese Office Action dated Jun. 20, 2016; Appln. No. 201310484547.9.

* cited by examiner

THIN FILM TRANSISTOR, FABRICATION METHOD THEREOF, REPAIR METHOD THEREOF AND ARRAY SUBSTRATE

TECHNICAL FIELD

Embodiments of the disclosure relate to a thin film transistor, a fabrication method thereof, a repair method thereof, and an array substrate comprising the thin film transistor.

BACKGROUND

At present, an active-matrix liquid crystal display is widely used, and mainly comprises an array substrate, a color filter substrate and a liquid crystal molecule layer provided between the array substrate and the color filter substrate. As shown in FIG. 1, FIG. 2 and FIG. 3, the array substrate is provided with a plurality of pixel units, and each pixel unit comprises a thin film transistor 1 and a pixel electrode 20. The thin film transistor 1 serves as a switch for controlling the pixel electrode so as to determine whether a voltage is applied to the pixel electrode 20 or not and then determine whether the pixel unit displays or not. The thin film transistor 1 generally comprises a gate electrode 12, a gate insulating layer 13, an active layer 14, a source electrode 16, and a drain electrode 17, etc.

In a fabrication process of the array substrate, the source electrode 16 and the drain electrode 17 of the thin film transistor 1 are formed in a single patterning process, and a short circuit is apt to occur between the source electrode 16 and the drain electrode 17. In particular, in the case that a gray-tone or half-tone mask is used in the fabrication process of the array substrate to simultaneously form the source electrode 16, the drain electrode 17 and the active layer 14, the short circuit is more apt to occur between the source electrode 16 and the drain electrode 17.

In the case that the short circuit occurs between the source electrode 16 and the drain electrode 17 of the thin film transistor 1 in a certain pixel unit, a repair method is performed to cut off a portion where the source electrode 16 of the thin film transistor 1 is connected with a data line 15, so that the pixel unit becomes a dark spot. The above-described repair method will result in a decreased of the yield of the array substrate.

SUMMARY

According to embodiments of the present disclosure, there is provided a thin film transistor. The thin film transistor comprises: a gate electrode, a gate insulating layer, an active layer, a source electrode and a drain electrode. The source electrode comprises a first source electrode portion and a second source electrode portion independent from each other, the first source electrode portion and the second source electrode portion are electrically connected with the active layer, respectively; and/or, the drain electrode comprises a first drain electrode portion and a second drain electrode portion independent from each other, the first drain electrode portion and the second drain electrode portion are electrically connected with the active layer, respectively.

For example, the first source electrode portion and the second source electrode portion are disposed in a same layer; and the first drain electrode portion and the second drain electrode portion are disposed in a same layer.

For example, the source electrode and the drain electrode are disposed in a same layer, the source electrode comprises the first source electrode portion and the second source electrode portion independent from each other, and the drain electrode is provided between the first source electrode portion and the second source electrode portion.

For example, the drain electrode comprises the first drain electrode portion and the second drain electrode portion independent from each other, and both the first drain electrode portion and the second drain electrode portion are provided between the first source electrode portion and the second source electrode portion.

For example, the source electrode and the drain electrode are disposed in a same layer, the drain electrode comprises the first drain electrode portion and the second drain electrode portion independent from each other, and the first drain electrode portion and the second drain electrode portion are disposed side by side and are provided within an opening of the source electrode.

According to embodiments of the present disclosure, there is provided an array substrate. The array substrate comprises a plurality of gate lines, a plurality of data lines, and a plurality of pixel units defined by intersecting the plurality of gate lines with the plurality of data lines, each of the pixel units comprises a pixel electrode and a thin film transistor. The thin film transistor is the thin film transistor as described above.

For example, the first source electrode portion and the second source electrode portion of the thin film transistor are respectively connected with a same data line; and the first drain electrode portion and the second drain electrode portion are respectively connected with a same pixel electrode.

According to embodiments of the present disclosure, there is provided a fabrication method of a thin film transistor. The method comprises: forming a source-drain electrode layer pattern comprising a source electrode and a drain electrode. The source electrode comprises a first source electrode portion and a second source electrode portion independent from each other; and/or, the drain electrode comprises a first drain electrode portion and a second drain electrode portion independent from each other.

For example, the method comprises: forming a gate electrode layer, and forming a gate electrode layer pattern comprising a gate electrode by a patterning process; forming a gate insulating layer; forming an active layer thin film and a source-drain electrode layer thin film, and forming an active layer and the source-drain electrode layer pattern comprising the source electrode and the drain electrode by a patterning process, the source electrode comprising the first source electrode portion and the second source electrode portion independent from each other and respectively electrically connected with the active layer; and/or, the drain electrode comprising the first drain electrode portion and the second drain electrode portion independent from each other and respectively electrically connected with the active layer; forming a passivation layer thin film, and forming a passivation layer pattern comprising a via hole by a patterning process; and forming a pixel electrode layer thin film, and forming, a pixel electrode layer pattern comprising a pixel electrode by a patterning process, the pixel electrode being connected with the drain electrode through the via hole.

According to embodiments of the present disclosure, there is provided a repair method of a thin film transistor for repairing a short circuit between a source electrode and a drain electrode of a thin film transistor. The source electrode of the thin film transistor comprises a first source electrode portion and a second source electrode portion independent from each other, and/or, the drain electrode of the thin film transistor comprises a first drain electrode portion and a second drain electrode portion independent from each other. The source electrode is connected with a data line and the drain electrode is electrically connected with a pixel electrode. The repair method comprises: cutting off a connection between the first source electrode portion and the data line in the case that a short circuit occurs between the first source electrode portion and the drain electrode; cutting off a connection between the second source electrode portion and the data line in the case that a short circuit occurs between the second source electrode portion and the drain electrode; cutting off a connection between the first drain electrode portion and the pixel electrode in the case that a short circuit occurs between the first drain electrode portion and the source electrode; cutting off a connection between the second drain electrode portion and the pixel electrode in the case that a short circuit occurs between the second drain electrode portion and the source electrode; cutting off the connection between the first source electrode portion and the data line and/or cutting off the connection between the first drain electrode portion and the pixel electrode in the case that a short circuit occurs between the first source electrode portion and the first drain electrode portion; cutting off the connection between the first source electrode portion and the data line and/or cutting off the connection between the second drain electrode portion and the pixel electrode in the case that a short circuit occurs between the first source electrode portion and the second drain electrode portion; cutting off the connection between the second source electrode portion and the data line and/or cutting off the connection between the first drain electrode portion and the pixel electrode in the case that a short circuit occurs between the second source electrode portion and the first drain electrode portion; cutting off the connection between the second source electrode portion and the data line and/or cutting off the connection between the second drain electrode portion and the pixel electrode in the case that a short circuit occurs between the second source electrode portion and the second drain electrode portion.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiment One

Figure 1:
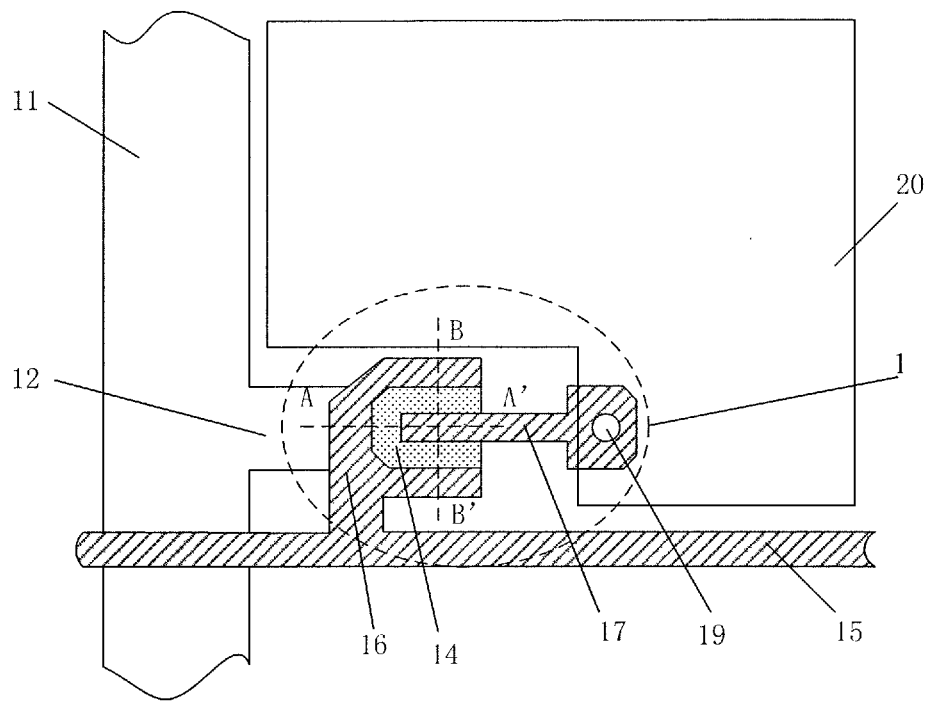
FIG. 1 is a plan view of an array substrate according to one technique.
Figure 2:
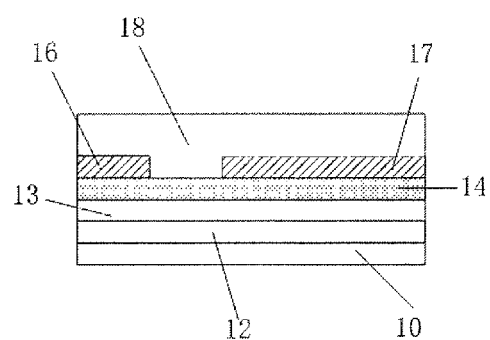
FIG. 2 is a partial cross-sectional view of the array substrate according to one technique along an A-A' direction.
Figure 3:
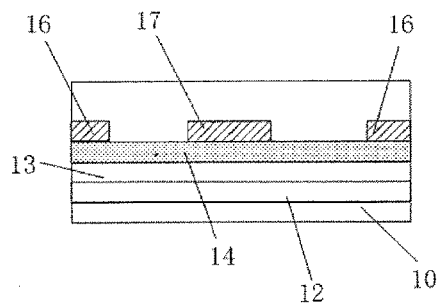
FIG. 3 is a partial cross-sectional view of the array substrate according to one technique along an B-B' direction.
Figure 4:
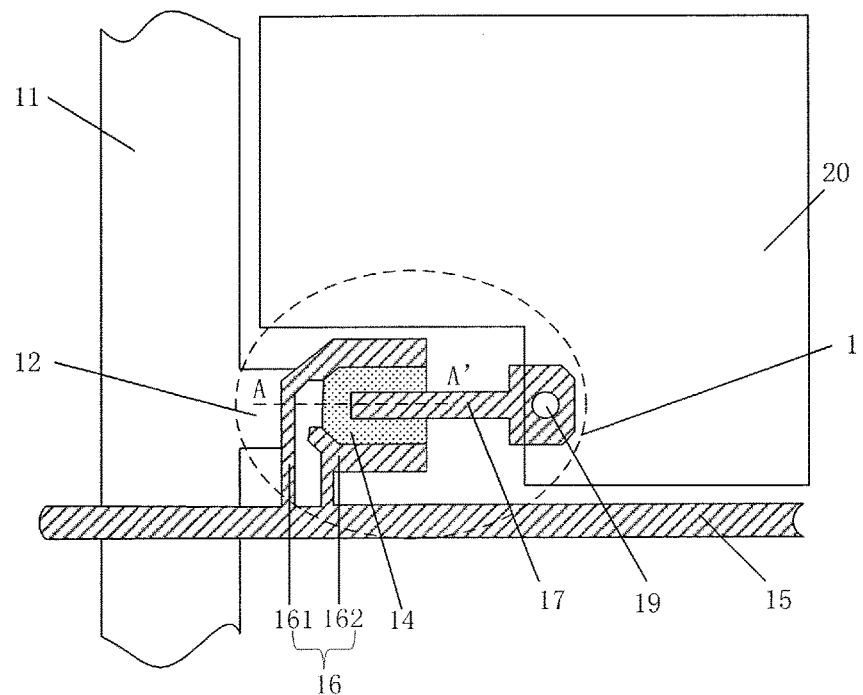
FIG. 4 is a plan view of a first type array substrate according to embodiments of the present disclosure.
Figure 5:
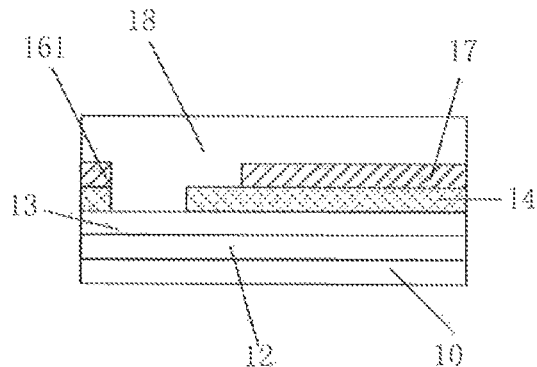
FIG. 5 is a partial cross-sectional view of the first type array substrate according to the embodiments of the present disclosure along the A-A' direction.
Figure 6:
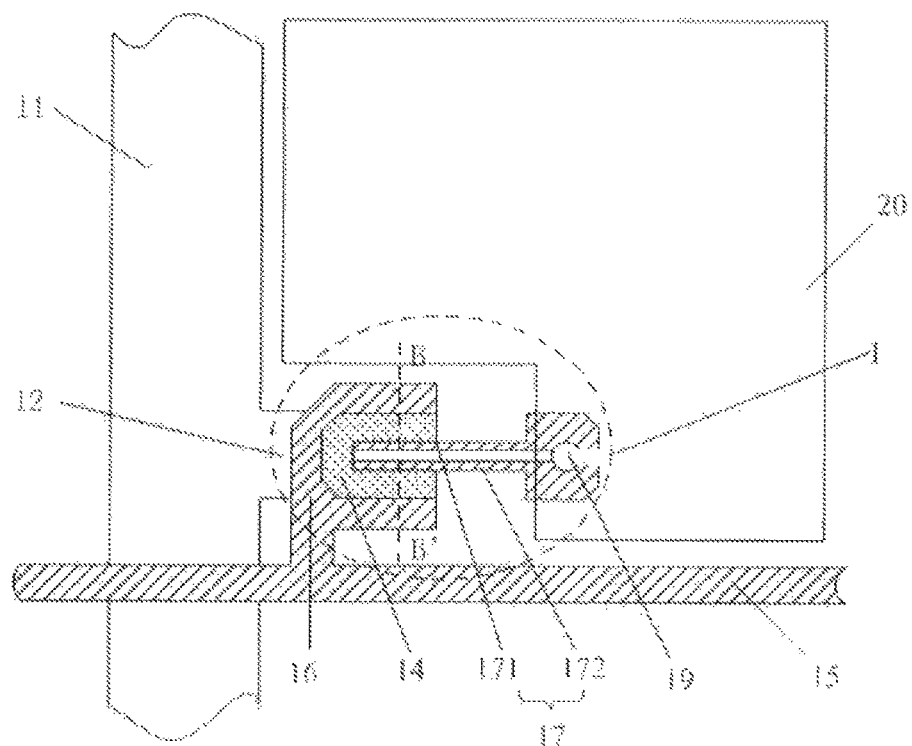
FIG. 6 is a plan view of a second type array substrate according to the embodiments of the present disclosure.
Figure 7:
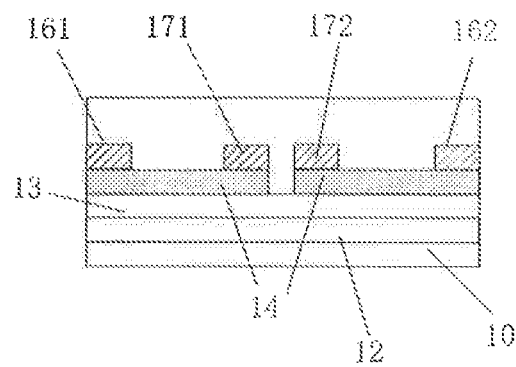
FIG. 7 is a partial cross-sectional view of the second type array substrate according to the embodiments of the present disclosure along the B-B' direction.
Figure 8:
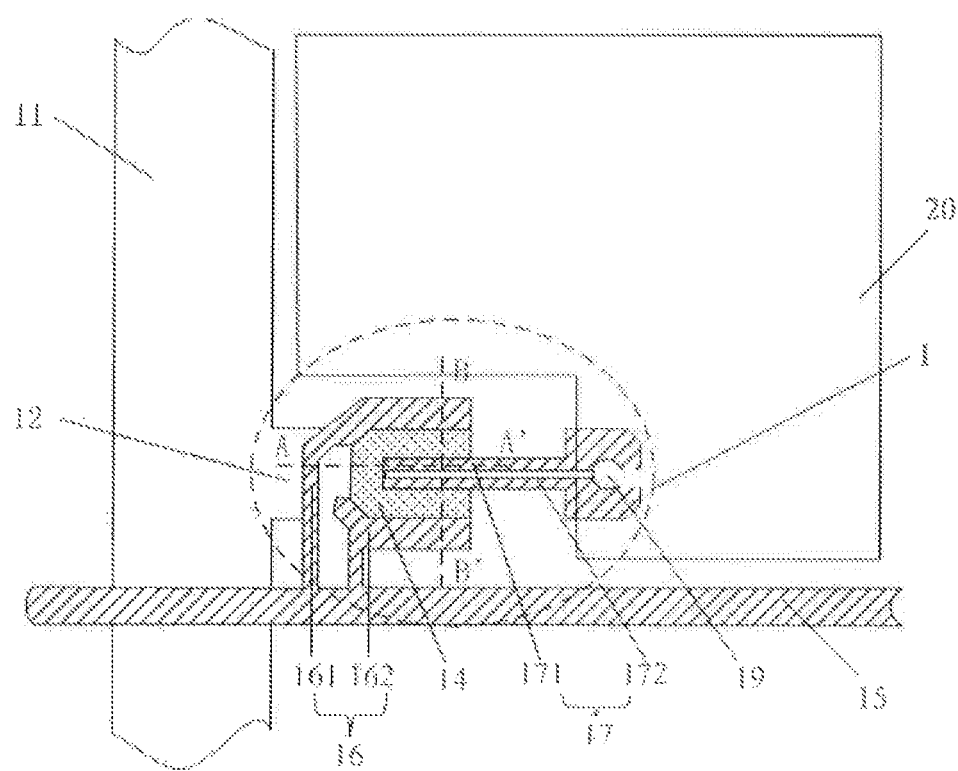
FIG. 8 is a plan view of a third type array substrate according to the embodiments of the present disclosure.

The embodiments of the present disclosure provide a thin film transistor, as shown by a dashed-box region in FIG. 4, FIG. 6 and FIG. 8 as well as FIG. 5, FIG. 7, FIG. 9 and FIG. 10, the thin film transistor 1 comprises: a gate electrode 12, a gate insulating layer 13, an active layer 14, a source electrode 16 and a drain electrode 17. The source electrode 16 comprises a first source electrode portion 161 and a second source electrode portion 162 independent from each other, the first source electrode portion 161 and the second source electrode portion 162 are electrically connected with the active layer 14, respectively; and/or, the drain electrode 17 comprises a first drain electrode portion 171 and a second drain electrode portion 172 independent from each other, the first drain electrode portion 171 and the second drain electrode portion 172 are electrically connected with the active layer 14, respectively.

For example, the first source electrode portion 161 and the second source electrode portion 162 are disposed in a same layer; and the first drain electrode portion 171 and the second drain electrode portion 172 are disposed in a same layer.

The thin film transistor according to the embodiments of the present disclosure has the structure as described above, the source electrode of the thin film transistor comprises a plurality of source electrode portions independent from each other and/or the drain electrode of the thin film transistor comprises a plurality of drain electrode portions independent from each other, so that a plurality of parallel conductive channels are formed between a data line and a pixel electrode of the array substrate. In the case that a short circuit occurs between the source electrode and the drain electrode of the thin film transistor, it is only necessary to cut off the corresponding conductive channel where the short circuit occurs to repair the thin film transistor; the repaired thin film transistor works properly and a pixel unit comprising the repaired array substrate displays normally, which improves the yield of the array substrate.

For example, the above thin film transistor has three specific structures as follows.

First type: as shown in FIG. 4 and FIG. 5, the source electrode 16 of the thin film transistor 1 on the array substrate comprises the first source electrode portion 161 and the second source electrode portion 162 independent from each other, and the drain electrode 17 is of an integral structure. The source electrode 16 and the drain electrode 17 are disposed in the same layer, and the drain electrode 17 is provided between the first source electrode portion 161 and the second source electrode portion 162. Two parallel conductive channels are formed between the data line 15 and the pixel electrode 20 of the array substrate.

Second type: as shown in FIG. 6 and FIG. 7, the drain electrode 17 of the thin film transistor 1 on the array substrate comprises the first drain electrode portion 171 and the second drain electrode portion 172 independent from each other, and the source electrode 16 is of an integral structure. The source electrode 16 and the drain electrode 17 are disposed in the same layer, and the first drain electrode portion 171 and the second drain electrode portion 172 are disposed side by side and are provided within an opening of a U-shaped or a C-shaped pattern of the source electrode 16. Two parallel conductive channels are formed between the data line 15 and the pixel electrode 20 of the array substrate.

Figure 9:
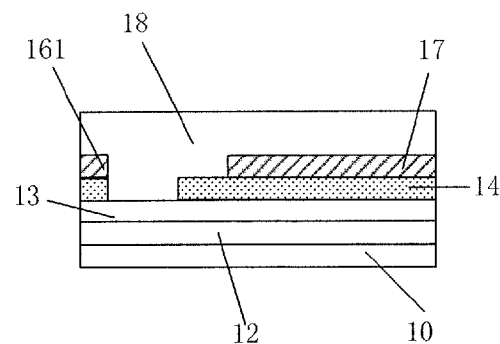
FIG. 9 is a partial cross-sectional view of the third type array substrate according to the embodiments of the present disclosure along the A-A' direction.
Figure 10:
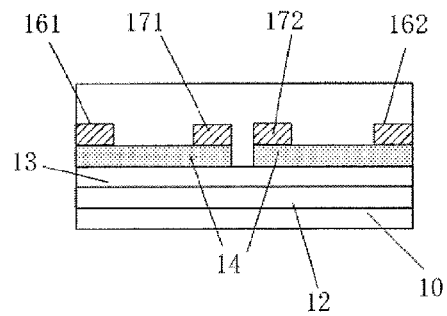
FIG. 10 is a partial cross-sectional view of the third type array substrate according to the embodiments of the present disclosure along the B-B' direction.

Third type: as shown in FIG. 8, FIG. 9 and FIG. 10, the source electrode 16 of the thin film transistor 1 on the array substrate comprises the first source electrode portion 161 and the second source electrode portion 162 independent from each other, and the drain electrode 17 comprises the first drain electrode portion 171 and the second drain electrode portion 172 independent from each other. The source electrode 16 and the drain electrode 17 are disposed in the same layer, and both the first drain electrode portion 171 and the second drain electrode portion 172 are provided between the first source electrode portion 161 and the second source electrode portion 162. A plurality of parallel conductive channels are formed between the data line 15 and the pixel electrode 20 of the array substrate.

It should be noted that, the source electrode 16 at least comprises the first source electrode portion 161 and the second source electrode portion 162 independent from each other; that is, the source electrode 16 is not limited to only comprises the first source electrode portion 161 and the second source electrode portion 162 independent from each other, the source electrode 16 may comprise a plurality of source electrode portions independent from each other, and the embodiments of the present disclosure only illustrate the case where the source electrode 16 comprises the first source electrode portion 161 and the second source electrode portion 162 independent from each other as an example. In addition, relative positions and shapes of the first source electrode portion 161 and the second source electrode portion 162 may be adjusted according to actual situations.

Similarly, the drain electrode 17 is not limited to only comprise the first drain electrode portion 171 and the second drain electrode portion 172 independent from each other, and the drain electrode may comprise a plurality of drain electrode portions independent from each other. Relative positions and shapes of the first drain electrode portions 171 and second drain electrode portions 172 may be adjusted according to actual situations. In addition, relative positions of the source electrode portion and the drain electrode portion may be adjusted according to actual situations, which will not be limited by the embodiments of the present disclosure.

In addition, in order to prevent occurrence of short circuit between different source electrode portions or between different drain electrode portions, a distance between the source electrode portions, a distance between the drain electrode portions, a distance between the source electrode portion and the data line 15, and a distance between the drain electrode and the data line 15 may be designed according to actual situations, which will not be limited by the embodiments of the present disclosure.

Embodiment Two

The embodiments of the present disclosure further provide an array substrate, as shown in FIG. 4, FIG. 6 and FIG. 8, the array substrate comprises a plurality of gate lines 11 and a plurality of data lines 15, and a plurality of pixel units defined by intersecting the plurality of gate lines 11 with the plurality of data lines 15, each of the pixel units comprises the pixel electrode 20 and the thin film transistor 1, and the thin film transistor 1 is the thin film transistor as described in Embodiment One.

The first source electrode portion 161 and the second source electrode portion 162 of the thin film transistor 1 are respectively connected with the same data line 15. The first drain electrode portion 171 and the second drain electrode portion 172 are respectively connected with the same pixel electrode 20.

In the array substrate having the above-described structure, in the case that a short circuit occurs between the source electrode and the drain electrode of the thin film transistor so that the pixel unit having the short circuit is unable to work properly, the pixel unit can be easily repaired, and the repaired pixel unit can work properly, which improves the yield of the array substrate.

Further, the array substrate may be the array substrate with the thin film transistor of bottom gate type, or the array substrate with the thin film transistor of top gate type. The array substrate may be array substrates of different types such as a Twisted Nematic (TN) array substrate, an Advanced-Super Dimensional Switching (AD-SDS) array substrate and the like.

Exemplarily, as shown in FIG. 4 to FIG. 10, in the case that the array substrate is the array substrate with the thin film transistor of bottom gate type, the array substrate comprises: a base substrate 10, and the gate line 11 and the gate electrode 12 provided on the base substrate 10

The base substrate 10 is for example a glass substrate of good transmittance or a transparent resin substrate.

The gate line 11 and the gate electrode 12 may be of either a single-layer structure or a multilayer structure. In the case that the gate line 11 and the gate electrode 12 are of the single-layer structure, they may be made of a material such as copper, aluminum, silver, molybdenum, chromium, neodymium, nickel, manganese, titanium, tantalum, tungsten or an alloy thereof; and in the case that the gate line 11 and the gate electrode 12 are of the multilayer structure, they may be made of copper\titanium, copper\molybdenum, molybdenum\aluminum\molybdenum and the like. The gate line 11 and the gate electrode 12 may be directly provided on the base substrate 10, or a buffer layer may be disposed between the gate line 11 as well as the gate electrode 12 and the base substrate 10, and the buffer layer may be made of silicon nitride or silicon oxide.

It should be noted that, the gate line 11 and the gate electrode 12 may be of two different components, or a portion the gate line may be directly used as the gate electrode, which will not be limited by the embodiments of the present disclosure.

The array substrate further comprises the gate insulating layer 13 provided on the gate line 11 and the gate electrode 12. The gate insulating layer 13 may be made of a material such as silicon nitride, silicon oxide or silicon oxynitride. The gate insulating layer 13 may be of a single-layer structure, or may be of a double-layer structure formed of silicon nitride and silicon oxide.

The array substrate further comprises the active layer 14 provided on the gate insulating layer 13. The active layer 14 may be made of a semiconductor material such as an amorphous silicon thin film, a polycrystalline silicon thin film, a monocrystalline silicon thin film, a metal oxide and the like. The active layer 14 may be of a U-shaped structure, or may be of a C-shaped structure, or may be of an inverted U-shaped structure, which will not be limited by the embodiments of the present disclosure. Further, the active layer 14 may have a disconnected or continuous bottom portion, i.e., the active layer 14 may be of an integral structure, or may be of a structure comprising two or more independent portions. For example, as shown in FIG. 7, the active layer 14 comprises two independent portions, one portion is disposed below the first source electrode portion 161 and the first drain electrode portion 171, and the other portion is disposed below the second source electrode portion 162 and the second drain electrode portion 172.

The array substrate further comprises the data line 15, the source electrode 16 and the drain electrode 17 provided on the active layer 14. The data line 15, the source electrode 16 and the drain electrode 17 may be of either a single-layer structure or a multilayer structure. In the case that the data line 15, the source electrode 16 and the drain electrode 17 are of a single-layer structure, they may be made of a material such as copper, aluminum, silver, molybdenum, chromium, neodymium, nickel, manganese, titanium, tantalum, tungsten or an alloy thereof; and in the case that the data line 15, the source electrode 16 and the drain electrode 17 are of a multilayer structure, they may be made of copper\titanium, copper\molybdenum, and molybdenum\aluminum\molybdenum, etc.

The first source electrode portion 161 and the second source electrode portion 162 independent from each other and comprised in the source electrode 16 may be made of the same material or may be made of different materials, and may be disposed in the same layer or may not be disposed in the same layer. The first drain electrode portion 171 and the second drain electrode portion 172 independent from each other and comprised in the drain electrode 17 may be made of the same material or may be made of different materials, and may be disposed in the same layer or may not be disposed in the same layer. For example, in the embodiments of the present disclosure, the first source electrode portion 161 and the second source electrode portion 162 independent from each other and comprised in the source electrode 16 are made of the same material, and the first source electrode portion 161 and the second source electrode portion 162 are disposed in the same layer and formed by a same patterning process. Similarly, for example, the first drain electrode portion 171 and the second drain electrode portion 172 independent from each other and comprised in the drain electrode 17 are made of the same material, and the first drain electrode portion 171 and the second drain electrode portion 172 are disposed in the same layer and formed by a same patterning process.

The array substrate further comprises a passivation layer 18 provided on the data line 15, the source electrode 16 and the drain electrode 17. The passivation layer 18 may be of a single-layer structure formed of silicon nitride, silicon oxide, or silicon oxynitride, or may be of a double-layer structure formed of silicon nitride and silicon oxide. In addition, the passivation layer 18 may be made of an organic resin, for example, acrylic resin, polyimide and polyamide, etc.

The array substrate further comprises the pixel electrode 20 provided on the passivation layer 18. The pixel electrode 20 may be made of a transparent conductive material such as indium tin oxide, indium zinc oxide and the like. The pixel electrode 20 is electrically connected with the drain electrode 17 through a via hole 19 in the passivation layer 18.

It should be noted that, the structure of the array substrate is not limited to the structures as described above, and may be adjusted according to actual situations, which will not be limited by the embodiments of the present disclosure.

Embodiment Three

The embodiments of the present disclosure further provide a fabrication method of a thin film transistor; the method comprises the following steps.

Step S111: forming a source-drain electrode layer pattern comprising the source electrode 16 and the drain electrode 17, wherein, the source electrode 16 comprises the first source electrode portion 161 and the second source electrode portion 162 independent from each other; and/or, the drain electrode 17 comprises the first drain electrode portion 171 and the second drain electrode portion 172 independent from each other.

The thin film transistor fabricated by the above-described fabrication method is easily repaired in the case that a short circuit occurs between the source electrode and the drain electrode, which improves the yield of the array substrate.

The thin film transistor may be a thin film transistor of bottom gate type, a thin film transistor of top gate type, or any other thin film transistor of any other structure.

Exemplarily, in the case that the thin film transistor is the thin film transistor of bottom gate type, the fabrication method of the thin film transistor comprises the steps as follows.

Step S121: forming a gate electrode layer, and forming a gate electrode layer pattern comprising the gate electrode by a patterning process;

Firstly, the gate electrode layer is formed on the base substrate 10 by using a method such as sputtering or thermal evaporation. Before forming the gate electrode layer, the buffer layer may be formed on the base substrate 10 in advance.

Secondly, a layer of photoresist is coated on the gate electrode layer, the photoresist is exposed by a mask having a pattern corresponding to the gate electrode 12, and then developing and etching processes are performed and finally the photoresist is stripped, to form the gate electrode layer pattern comprising the gate electrode 12.

Step S122: forming the gate insulating layer.

The gate insulating layer 13 is formed on the gate electrode layer pattern comprising the gate electrode 12 by using a method such as plasma enhanced chemical vapor deposition.

Step S123: forming an active layer thin film and a source-drain electrode layer thin film, and forming the active layer and the source-drain electrode layer pattern comprising the source electrode and the drain electrode by a patterning process, the source electrode comprising the first source electrode portion and the second source electrode portion independent from each other and respectively electrically connected with the active layer; and/or, the drain electrode comprising the first drain electrode portion and the second drain electrode portion independent from each other and respectively electrically connected with the active layer;

For example, a layer of active layer thin film is firstly formed on the gate insulating layer 13 by using a method such as plasma enhanced chemical vapor deposition or sputtering. Then, the source-drain electrode layer thin film is formed on the active layer thin film by using a method such as sputtering or thermal evaporation. Next, exposing, developing, a first etching, aching and a second etching processes are performed by using a gray-tone or a half-tone mask having patterns corresponding to the active layer 14, the source electrode 16 and the drain electrode 17. Finally, the photoresist is stripped to form the active layer 14 and the source-drain electrode layer pattern comprising the source electrode 16 and the drain electrode 17.

Alternatively, the active layer thin film is firstly formed on the gate insulating layer 13 and the active layer 14 is formed by a patterning process with a normal mask; then the source-drain electrode layer thin film is formed on the active layer 14, and the source-drain electrode layer pattern comprising the source electrode 16 and the drain electrode 17 is formed by a patterning process with a normal mask.

The formed source electrode 16 comprises the first source electrode portion 161 and the second source electrode portion 162 independent from each other and are respectively electrically connected with the active layer 14; and/or, the formed drain electrode 17 comprises the first drain electrode portion 171 and the second drain electrode portion 172 independent from each other and are respectively electrically connected with the active layer 14.

The embodiments of the present disclosure further provide a fabrication method of an array substrate. In addition to the above steps S121~S123, the fabrication method of the array substrate further comprises the following steps.

Step S124: forming a passivation layer thin film, and forming a passivation layer pattern comprising the via hole by a patterning process.

For example, in the case that the passivation layer 18 is made of a material such as silicon nitride or silicon oxide, the passivation layer thin film may be formed on the formed source-drain electrode layer pattern comprising the source electrode 16 and the drain electrode 17 by using a method such as plasma enhanced chemical vapor deposition; in the case that the passivation layer 18 is made of an organic resin, the organic resin is coated on the source-drain electrode layer pattern comprising the source electrode 16 and the drain electrode 17 to form the passivation layer thin film.

Then, a layer of photoresist is coated on the formed passivation layer thin film, the photoresist is exposed by using a mask having a pattern corresponding to the via hole 19, exposing, developing and etching processes are performed, finally the photoresist is stripped, to form the passivation layer pattern comprising the via hole 19.

Step S125: forming a pixel electrode layer thin film, and forming a pixel electrode layer pattern comprising the pixel electrode by a patterning process, the pixel electrode being connected with the drain electrode through the via hole.

A transparent conductive layer is formed on the passivation layer 18 by depositing, sputtering, coating, etc., then a layer of photoresist is coated on the transparent conductive layer, the photoresist is exposed by using a mask having a pattern corresponding to the pixel electrode 20, exposing, developing and etching are performed, and finally the photoresist is stripped, to form the pattern comprising the pixel electrode 20. The pixel electrode 20 is electrically connected with the drain electrode 17 through the via hole 19.

It should be noted that, the fabrication method of the array substrate is not limited to the above-described fabrication steps, for example, the first source electrode portion 161 and the second source electrode portion 162 independent from each other and comprised in the source electrode 16 may be disposed in the same layer or may not be disposed in the same layer, and may be formed by a same patterning process or may be formed by two patterning processes. For example, in the embodiments of the present disclosure, the first source electrode portion 161 and the second source electrode portion 162 independent from each other are disposed in the same layer and are formed by the same patterning process. Similarly, for example, the first drain electrode portion 171 and the second drain electrode portion 172 independent from each other are disposed in the same layer and are formed by the same patterning process.

Embodiment Four

The embodiments of the present disclosure further provide a repair method of the thin film transistor 1, for repairing, a short circuit between the source electrode 16 and the drain electrode 17 of the thin film transistor 1. The source electrode 16 of the thin film transistor 1 comprises the first source electrode portion 161 and the second source electrode portion 162 independent from each other, and/or, the drain electrode 17 of the thin film transistor 1 comprises the first drain electrode portion 171 and the second drain electrode portion 172 independent from each other, the source electrode 16 is connected with the data line 15, and the drain electrode 17 is connected with the pixel electrode 20.

Figure 11:
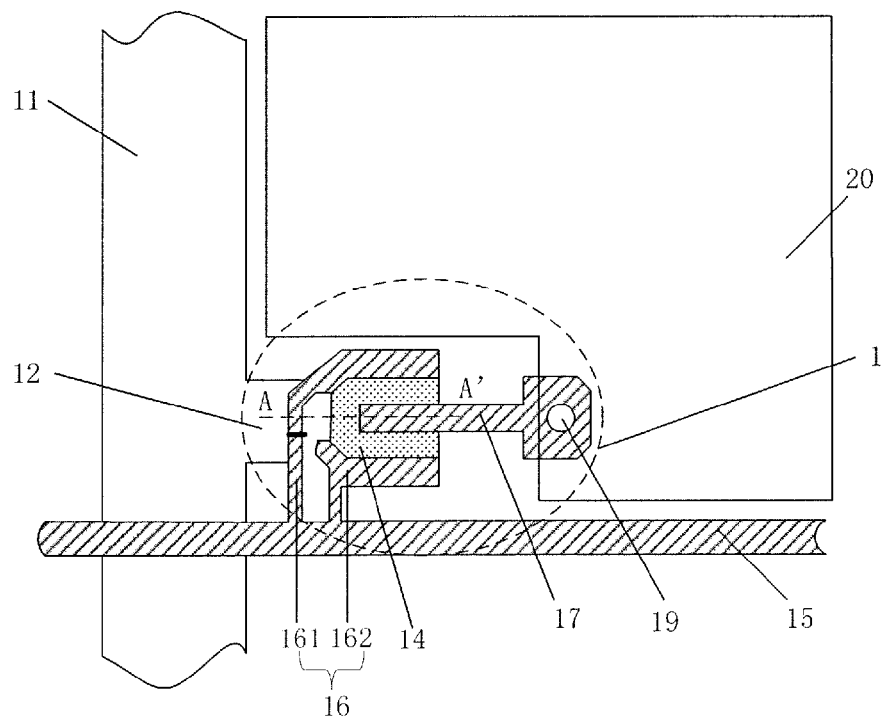
FIG. 11 is a schematic view of repairing a pixel unit of the first type array substrate according to the embodiments of the present disclosure.

For the thin film transistor 1 shown in FIG. 4, the repair method thereof is shown in FIG. 11. A connection between the first source electrode portion 161 and the data line 15 is cut off in the case that the short circuit occurs between the first source electrode portion 161 and the drain electrode 17 (the cut line is shown by thick black short line in the diagram); likewise, a connection between the second source electrode portion 162 and the data line 15 is cut off in the case that a short circuit occurs between the second source electrode portion 162 and the drain electrode 17.

Figure 12:
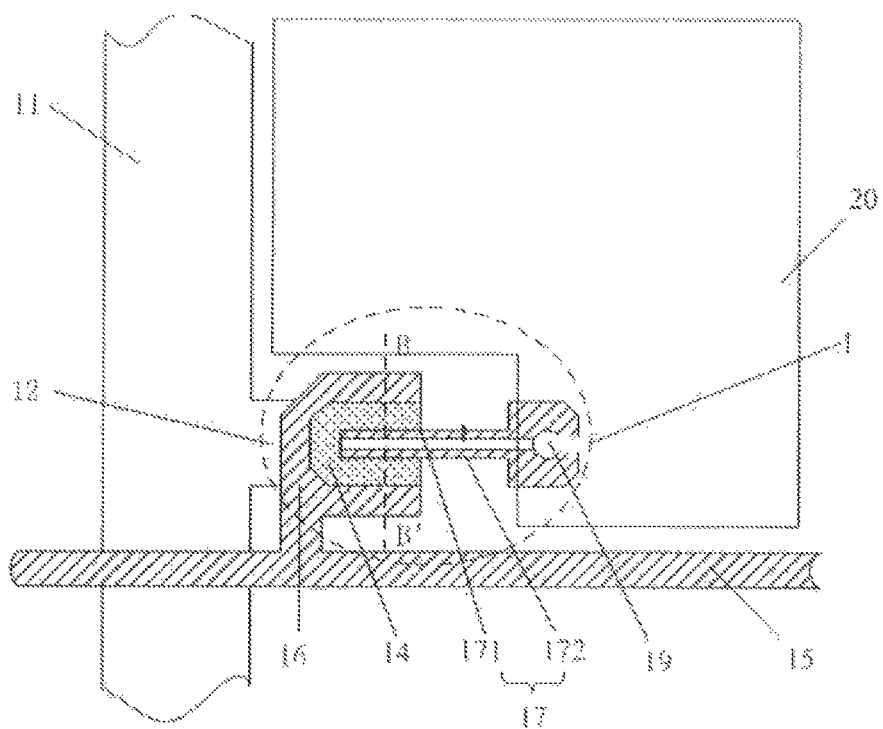
FIG. 12 is a schematic view of repairing the pixel unit of the second type array substrate according to the embodiments of the present disclosure.

For the thin film transistor 1 shown in FIG. 6, the repair method thereof is shown in FIG. 12. A connection between the first drain electrode portion 171 and the pixel electrode 20 is cut off in the case that the short circuit occurs between the first drain electrode portion 171 and the source electrode 16 (the cut line is shown by thick black short line in the diagram); likewise, a connection between the second drain electrode portion 172 and the pixel electrode 20 is cut off in the case that the short circuit occurs between the second drain electrode portion 172 and the source electrode 16.

Figure 13:
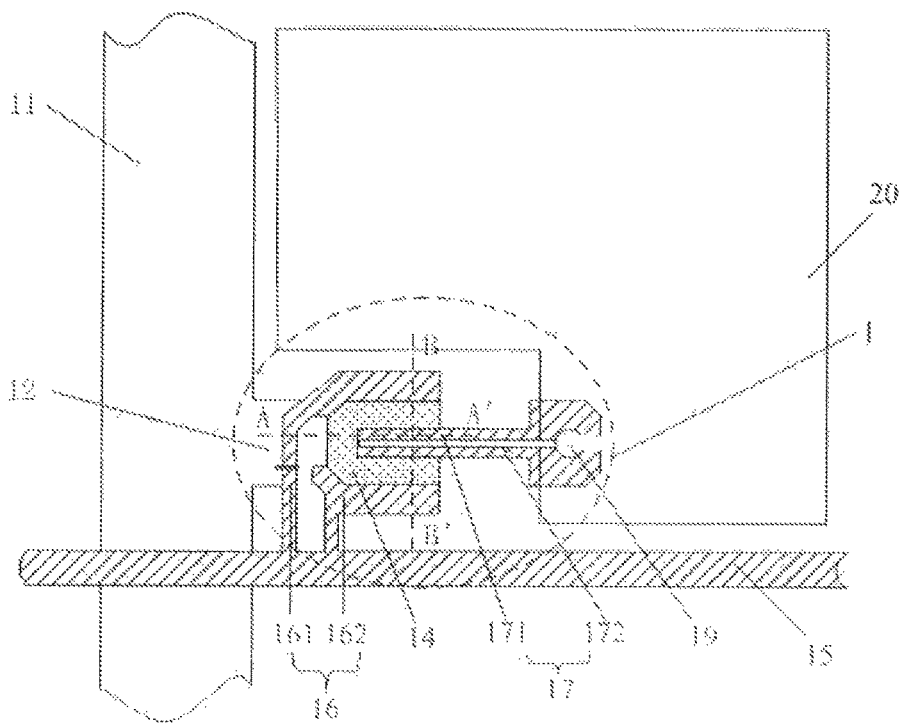
FIG. 13 is a schematic view of repairing the pixel unit of the third type array substrate according to the embodiments of the present disclosure.

For the thin film transistor 1 shown in FIG. 8, the repair method thereof is shown in FIG. 13. In the case that the short circuit occurs between the first source electrode portion 161 and the first drain electrode portion 171, the connection between the first source electrode portion 161 and the data line 15 is cut off (the cut line is shown by thick black short line in the diagram), and/or the connection between the first drain electrode portion 171 and the pixel electrode 20 is cut off. Likewise, in the case that the short circuit occurs between the first source electrode portion 161 and the second drain electrode portion 172, the connection between the first source electrode portion 161 and the data line 15 is cut off, and/or the connection between the second drain electrode portion 172 and the pixel electrode 20 is cut off. In the case that the short circuit occurs between the second source electrode portion 162 and the first drain electrode portion 171, the connection between the second source electrode portion 162 and the data line 15 is cut off, and/or the connection between the first drain electrode portion 171 and the pixel electrode 20 is cut off. In the case that the short circuit occurs between the second source electrode portion 162 and the second drain electrode portion 172, the connection between the second source electrode portion 162 and the data line 15 is cut off, and/or the connection between the second drain electrode portion 172 and the pixel electrode 20 is cut off.

The foregoing embodiments merely are exemplary embodiments of the disclosure, and not intended to define the scope of the disclosure, and the scope of the disclosure is determined by the appended claims.

The present application claims priority of Chinese Patent Application No. 201310484547.9 filed on Oct. 16, 2013, the disclosure of which is incorporated herein by reference in its entirety as part of the present application.

What is claimed is:

1. A thin film transistor, comprising: a gate electrode, a gate insulating layer, an active layer, a source electrode and a drain electrode, wherein, the thin film transistor is one thin film transistor,
the source electrode comprises a first source electrode portion and a second source electrode portion independent from each other, and the drain electrode is connected with the active layer; and
the drain electrode comprises a first drain electrode portion and a second drain electrode portion independent from each other, the first drain electrode portion and the second drain electrode portion are electrically connected with the active layer, respectively;
wherein the source electrode and the drain electrode are disposed in a same layer, and the first drain electrode portion and the second drain electrode portion are disposed side by side and are provided within an opening of a C-shaped pattern of the source electrode.

2. The thin film transistor according to claim 1, wherein, the first source electrode portion and the second source electrode portion are disposed in a same layer.

3. The thin film transistor according to claim 1, wherein, the source electrode and the drain electrode are disposed in a same layer.

4. An array substrate, comprising a plurality of gate lines, a plurality of data lines, and a plurality of pixel units defined by intersecting the plurality of gate lines with the plurality of data lines, each of the pixel units comprising a pixel electrode and a thin film transistor, wherein the thin film transistor is a thin film transistor according to claim 1.

5. The array substrate according to claim 4, wherein, the first source electrode portion and the second source electrode portion of the thin film transistor are respectively connected with a same data line; and the first drain electrode portion and the second drain electrode portion are respectively connected with a same pixel electrode.

6. A repair method of a thin film transistor, for repairing a short circuit between a source electrode and a drain electrode of a thin film transistor,
the source electrode of the thin film transistor comprising a first source electrode portion and a second source electrode portion independent from each other, and/or, the drain electrode of the thin film transistor comprising a first drain electrode portion and a second drain electrode portion independent from each other, the source electrode being connected with a data line and the drain electrode being electrically connected with a pixel electrode,
wherein the repair method comprises:
cutting off a connection between the first source electrode portion and the data line in the case that a short circuit occurs between the first source electrode portion and the drain electrode;
cutting off a connection between the second source electrode portion and the data line in the case that a short circuit occurs between the second source electrode portion and the drain electrode;
cutting off a connection between the first drain electrode portion and the pixel electrode in the case that a short circuit occurs between the first drain electrode portion and the source electrode;
cutting off a connection between the second drain electrode portion and the pixel electrode in the case that a short circuit occurs between the second drain electrode portion source electrode;
cutting off the connection between the first source electrode portion and the data line and/or cutting off the connection between the first drain electrode portion and the pixel electrode in the case that a short circuit occurs between the first source electrode portion and the first drain electrode portion;
cutting off the connection between the first source electrode portion and the data line and/or cutting off the connection between the second drain electrode portion and the pixel electrode in the case that a short circuit occurs between the first source electrode portion and the second drain electrode portion;
cutting off the connection between the second source electrode portion and the data line and/or cutting off the connection between the first drain electrode portion and the pixel electrode in the case that a short circuit occurs between the second source electrode portion and the first drain electrode portion;
cutting off the connection between the second source electrode portion and the data line and/or cutting off the connection between the second drain electrode portion and the pixel electrode in the case that a short circuit occurs between the second source electrode portion and the second drain electrode portion.

* * * * *